US012666551B2

(12) United States Patent
Jang

(10) Patent No.: US 12,666,551 B2
(45) Date of Patent: Jun. 23, 2026

(54) DISPLAY DEVICE

(71) Applicant: Samsung Display Co., LTD., Yongin-si (KR)

(72) Inventor: Min Sok Jang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 350 days.

(21) Appl. No.: 18/460,737

(22) Filed: Sep. 5, 2023

(65) Prior Publication Data

US 2024/0188233 A1    Jun. 6, 2024

(30) Foreign Application Priority Data

Dec. 1, 2022    (KR) ........................ 10-2022-0165844

(51) Int. Cl.
| | |
|---|---|
| *H05K 5/02* | (2006.01) |
| *H10K 59/12* | (2023.01) |
| *H10K 102/00* | (2023.01) |

(52) U.S. Cl.
CPC .............. *H05K 5/02* (2013.01); *H10K 59/12* (2023.02); *H10K 2102/311* (2023.02)

(58) Field of Classification Search
None
See application file for complete search history.

(56) References Cited

U.S. PATENT DOCUMENTS

| | | | | |
|---|---|---|---|---|
| 7,288,460 | B2 | 10/2007 | Mosley | |
| 11,175,693 | B2 * | 11/2021 | Song ...................... | G06F 1/1652 |
| 2003/0222334 | A1 * | 12/2003 | Ikeda .................. | G02F 1/13454 |
| | | | | 438/455 |
| 2006/0088724 | A1 * | 4/2006 | Yannetti ................ | B32B 15/088 |
| | | | | 428/626 |
| 2020/0068725 | A1 * | 2/2020 | Park ....................... | H10K 59/87 |
| 2020/0194710 | A1 * | 6/2020 | Zhao ...................... | H10K 50/87 |
| 2020/0274085 | A1 * | 8/2020 | Lee ..................... | H04M 1/0268 |
| 2021/0141124 | A1 * | 5/2021 | Park ..................... | H05K 5/0226 |
| 2021/0216106 | A1 * | 7/2021 | Soh ........................ | G06F 1/1652 |
| 2022/0016869 | A1 * | 1/2022 | Lin .......................... | C09K 5/14 |
| 2022/0210933 | A1 * | 6/2022 | Park ..................... | G06F 1/1626 |
| 2022/0285657 | A1 * | 9/2022 | Hong .................... | H10K 59/38 |

FOREIGN PATENT DOCUMENTS

| | | |
|---|---|---|
| KR | 10-2015-0104407 | 9/2015 |
| KR | 10-2016-0083608 | 7/2016 |
| KR | 10-2022-0007752 | 1/2022 |
| KR | 10-2022-0030512 | 3/2022 |
| KR | 10-2022-0099165 | 7/2022 |

* cited by examiner

*Primary Examiner* — Xanthia C Relford
(74) *Attorney, Agent, or Firm* — Lerner David LLP

(57) ABSTRACT

A display device including a display panel including a folding area and a non-folding area, and a first support member disposed under the display panel and supporting the display panel, the first support member including a first support layer including a porous layer including multiple holes disposed on at least one side, the porous layer overlaps the non-folding area.

17 Claims, 11 Drawing Sheets

DISPLAY DEVICE

CROSS-REFERENCE TO RELATED APPLICATIONS

This application claims priority under 35 U.S.C. § 119 from Korean Patent Application No. 10-2022-0165844 filed on Dec. 1, 2022 in the Korean Intellectual Property Office, the entire contents of which are incorporated herein by reference.

BACKGROUND

1. Technical Field

The disclosure relates to a foldable display device including a support member having a porous layer.

2. Description of the Related Art

Electronic devices such as smartphones, mobile phones, tablet personal computers, multimedia players, televisions, or monitors include display devices for displaying images. The display devices include display panels for realizing screens for displaying images. Transformable flexible display devices that may be bent, folded, rolled, or stretched may be developed by using flexible substrates. From among the flexible display devices, the foldable display device may be folded and unfolded like a book. The foldable display device needs a support member that may be light in weight and may have reinforced impact resistance to increase reliability.

The above information disclosed in this Background section is only for enhancement of understanding of the background of the disclosure, and therefore it may contain information that does not constitute prior art as per 35 U.S.C. § 102.

SUMMARY

The disclosure has been made in an effort to provide a foldable display device with increased product reliability.

As the foldable display device uses a flexible material, it may readily have appearance defects such as bright spots and scratches on the pixels because of external forces.

As rigidity of the support member used to the foldable display device increases, pressing and rigidity of the display device may be improved as merits. However, as rigidity of the support member increases, its repulsive force increases in case that it is folded, and it becomes difficult to reduce its weight. Therefore, as the foldable display device may be reduced in weight, it is required to use the support member with reinforced impact resistance.

An embodiment of the disclosure provides a display device that may include a display panel that may include a folding area and a non-folding area, and a first support member disposed under the display panel and supporting the display panel, wherein the first support member may include a first support layer that may include a porous layer that may include multiple holes disposed on at least one side, and the porous layer may overlap the non-folding area.

The porous layer may be disposed on an entire surface of the first support layer.

The first support layer may include an anodized metal.

The first support layer may include a metal base layer and an oxide film disposed on at least one side of the metal base layer.

The oxide film may include multiple holes, the oxide film may be disposed on both an upper side and a bottom side of the metal base layer.

The first support layer may include a folding portion that may overlap the folding area.

The first support member may further include a first metal layer disposed between the display panel and the first support layer, and the first metal layer may include a folding portion that may overlap the folding area.

The folding portion may be one of a pattern portion including an opening is disposed, a protrusion or depression pattern, and multiple links connected to (or extended from) one another to allow for rotation.

The first support member may also include a first metal layer disposed between the display panel and the first support layer, and cladding of a second metal layer disposed under the first support layer.

The metal base layer may include at least one of metal materials including Al, Ti, Cu, Mg, Zn, Ta, Hf, and Nb.

An embodiment of the disclosure provides a display device that may include a display panel, a first support member disposed under the display panel and supporting the display panel, and a second support member disposed under the first support member and supporting the display panel, wherein the first support member may include a first support layer that includes a porous layer that includes multiple holes disposed on at least one side.

The porous layer may be disposed on both an upper side and a bottom side of the first support layer.

The first support layer may include an anodized metal.

The display panel may include a folding area and a non-folding area, the second support member may include a first plate and a second plate that may overlap the non-folding area, and the first plate and the second plate may be spaced apart from each other in the folding area.

The first support member may include a folding portion that may overlap the folding area.

The second support member may include a second support layer that may include a porous layer that may include multiple holes disposed on at least one side.

The porous layer of the second support member may be disposed on an upper side and a bottom side of the second support layer.

The second support layer may include an anodized metal.

An embodiment of the disclosure provides a display device that may include a display panel, a first support member disposed under the display panel and supporting the display panel, and a second support member disposed under the first support member and supporting the display panel. The first support member may include a first metal layer, a second metal layer, and a first support layer disposed between the first metal layer and the second metal layer that may include multiple holes in at least one side, and the second support member may include a third metal layer, a fourth metal layer, and a second support layer disposed between the third metal layer and the fourth metal layer that may include multiple holes in at least one side.

The second support member may further include a first adhesive layer disposed between the third metal layer and the second support layer, and a second adhesive layer disposed between the second support layer and the fourth metal layer.

According to the embodiments, the foldable display device with increased product reliability may be provided. Further, the foldable display device allowing reduction of weight and reinforced impact resistance may be provided by using the support member including the porous layer that may include multiple holes are disposed in the surface.

BRIEF DESCRIPTION OF THE DRAWINGS

An additional appreciation according to the embodiments of the disclosure will become more apparent by describing in detail the embodiments thereof with reference to the accompanying drawings, wherein:

FIG. 5 shows a schematic cross-sectional view of a first support member and a second support member according to an embodiment;

FIG. 6 and FIG. 7 show schematic cross-sectional views of a first support member according to an embodiment;

DETAILED DESCRIPTION OF THE EMBODIMENTS

Figure 1:
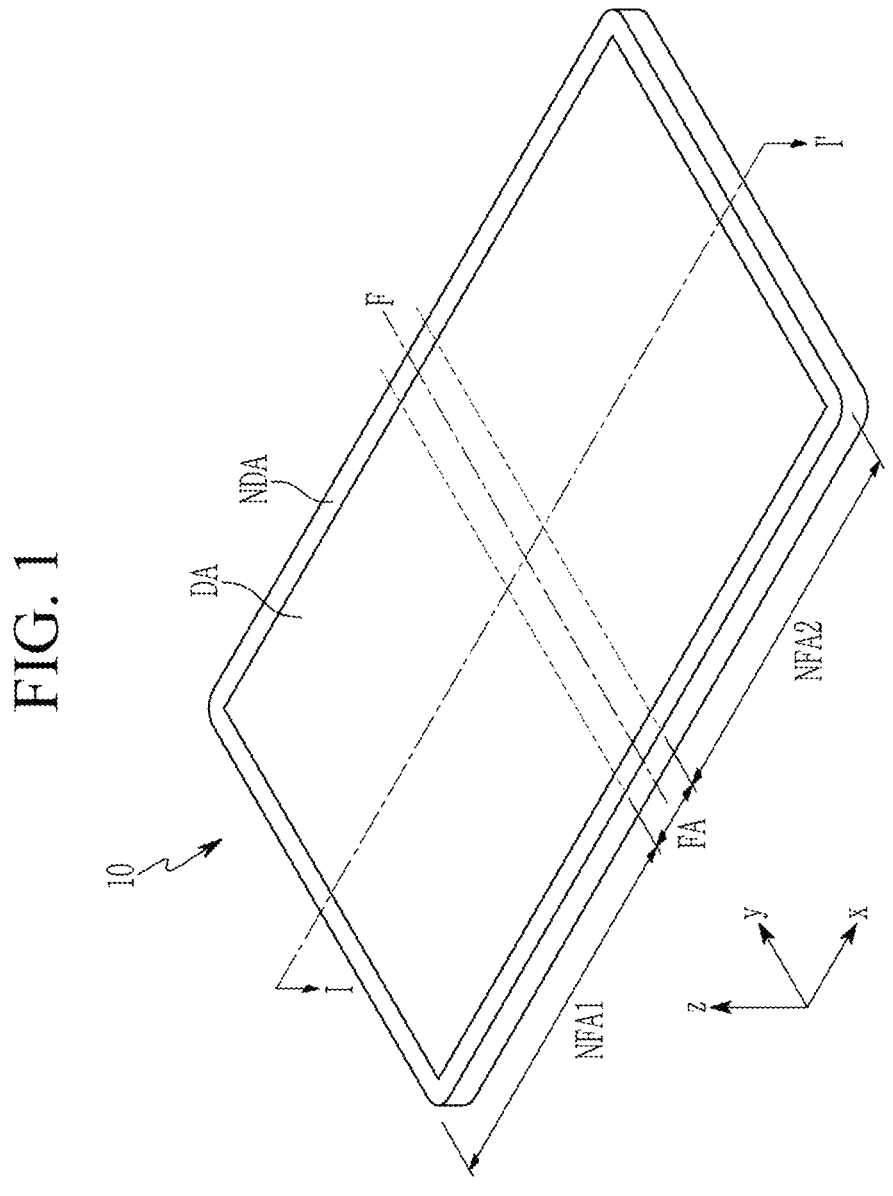
FIG. 1 shows a perspective view of an unfolded display device according to an embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in an embodiment.

Unless otherwise specified, the illustrated embodiments are to be understood as providing features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be predisposed differently from the described order. For example, two consecutively described processes may be predisposed substantially at the same time or predisposed in an order opposite to the described order. Also, like reference numerals and/or reference characters denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element. Further, the X-axis, the Y-axis, and the Z-axis may not be limited to three axes of a rectangular coordinate system, such as the x, y, and z axes, and may be interpreted in a broader sense. For example, the X-axis, the Y-axis, and the Z-axis may be perpendicular to one another, or may represent different directions that may not be perpendicular to one another.

For the purposes of this disclosure, "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items. A description that a component is "configured to" perform a specified operation may be defined as a case where the component is constructed and arranged with structural features that can cause the component to perform the specified operation.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, may not be necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be disposed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, portion, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein. Hereinafter, embodiments of the disclosure will be described in detail with reference to the accompanying drawings.

Figure 2:
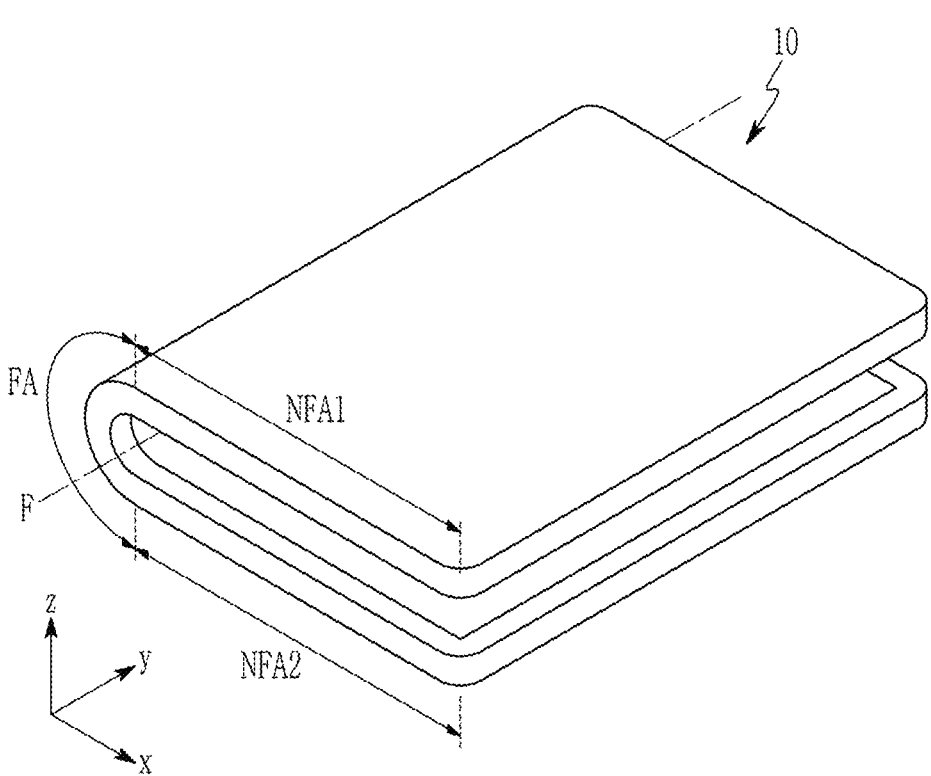
FIG. 2 shows a perspective view of a folded display device according to an embodiment.

FIG. 1 and FIG. 2 show perspective views of a display device according to an embodiment. FIG. 1 shows a perspective view of an unfolded display device according to an embodiment, and FIG. 2 shows a perspective view of a folded display device according to an embodiment.

Referring to FIG. 1 and FIG. 2, a first direction (x) may be a direction that is parallel to a first side of the display device 10 in a schematic plan view, for example, it may be a horizontal direction of the display device 10. A second direction (y) may be a direction that is parallel to a second side contacting the first side of the display device 10 in a plan view, for example, it may be a vertical direction of the display device 10. A third direction (z) may be a thickness direction of the display device 10.

The display device 10 includes a display area DA for displaying images and a non-display area NDA excluding the display area DA. The display area DA may include multiple pixels and may display images. The non-display area NDA includes no pixels, and it may be disposed around the display area DA.

The display device 10 may be unfolded to be generally flat as shown in FIG. 1. The display device 10 may include a first non-folding area NFA1, a second non-folding area NFA2, and a folding area FA between the first non-folding area NFA1 and the second non-folding area NFA2. The folding area FA is bent at the time of folding with respect to a folding axis (F), and the first non-folding area NFA1 and the second non-folding area NFA2 may not be bent. The folding area FA may be bent with respect to an axis that may be parallel to the second direction (y).

FIG. 1 and FIG. 2 show a folding area FA, and the display device 10 according to an embodiment may include at least one folding area FA. The at least one folding area FA may be folded with respect to the axis that may be parallel to the first direction (x) and/or the axis that may be parallel to the second direction (y), and positions and widths of the folding area FA may be modifiable in many ways in the display device 10.

The display device 10 may maintain a folded state and an unfolded state. The display device 10 may be folded according to an in-folding technique by which the display area DA may be disposed inward. In case that the display device 10 may be folded according to the in-folding technique, front surfaces of the display device 10 may face each other. In other words, the display areas DA of the first non-folding area NFA1 and the second non-folding area NFA2 may be bent to face each other. In case that display device 10 is folded inward with respect to the folding axis (F), the display areas DA may be invisible from the outside. In another variation, the display device 10 may instead be folded according to an out-folding technique by which the display area DA may be disposed outward. In case that the display device 10 may be folded according to the out-folding technique, rear sides of the display device 10 may face each other. In case that the display device 10 is folded outward with respect to the folding axis (F), the display areas DA of the display device 10 may be respectively disposed on the outside to display images in the respective directions.

Figure 3:
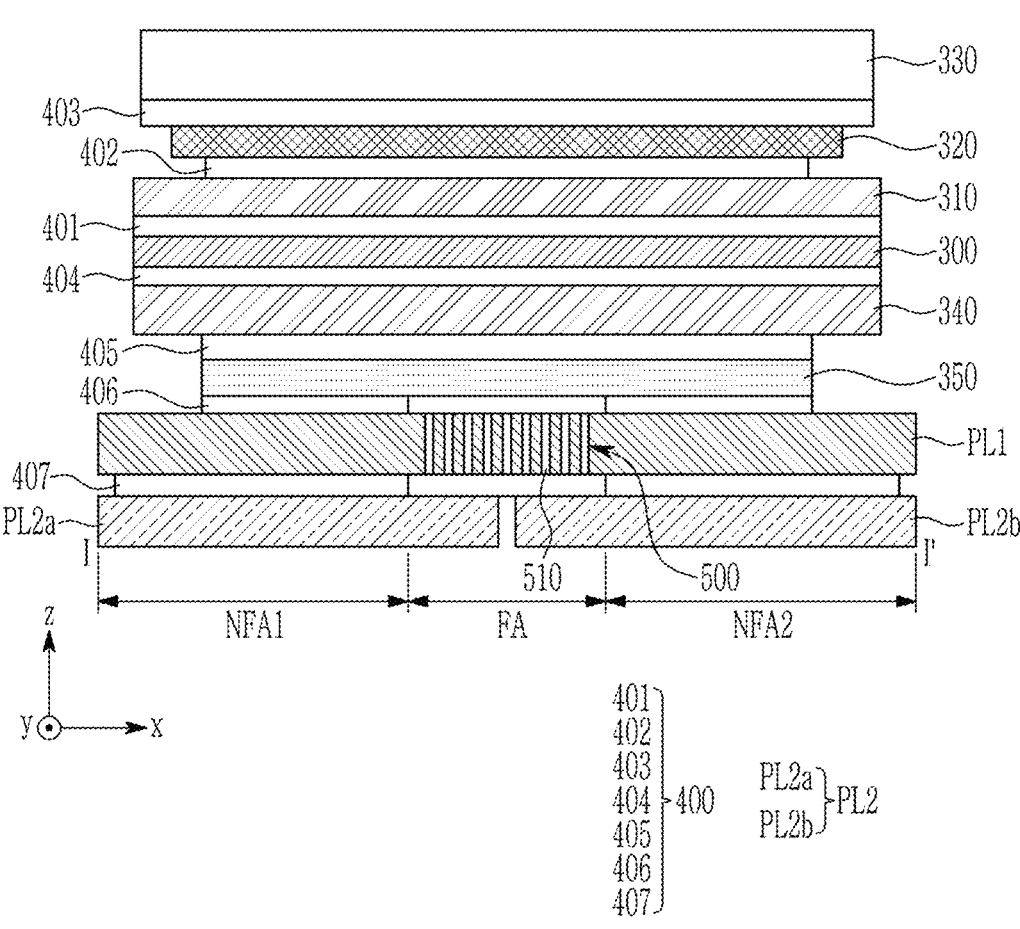
FIG. 3 shows a schematic cross-sectional view of a display device with respect to line I-I' of FIG. 1.

FIG. 3 shows a schematic cross-sectional view of a display device with respect to line I-I' of FIG. 1. In an embodiment, front sides (or upper sides) and rear sides (or lower sides) of respective members may be defined with respect to the direction in which images may be displayed. The front sides and the rear sides oppose each other in the third (or thickness) direction (z), and respective normal directions of the front sides and the rear sides may be parallel to the third direction (z). A spaced apart distance between the front side and the rear side in the third direction (z) may correspond to a thickness of the display panel in the third direction (z).

The display device 10 may include a window protection film 330, a window 320, an antireflection layer 310, a display panel 300, a protection film 340, a barrier film 350, a first support member PL1, and a second support member PL2. Although not shown, the display device 10 may further include a digitizer layer, a buffer member, and a shield member. Respective constituent elements configuring the display device 10 may be attached by adhesive members 400. The adhesive members 400 may be a pressure sensitive adhesive (PSA) or a thermoplastic polyurethane elastomer (TPU). The adhesive members 400 may also be an optically clear adhesive (OCA) film or an optically clear resin (OCR). The respective adhesive members 400 may be the same or may be different from each other. The display panel 300 may realize the screen for displaying images. A general stacking structure of the display panel 300 will be described later with reference to FIG. 11.

The antireflection layer 310 may be disposed on the front surface on which the images of the display panel 300 are displayed. The antireflection layer 310 may, for example, be a polarization film including a linear polarizer and a retarder. The antireflection layer 310 may function to prevent reflection of external light by blocking the light that may be reflected inside the display panel 300 and is then output. The antireflection layer 310 may be attached to the front surface of the display panel 300 by the first adhesive member 401 so that the images provided by the display panel 300 may be readily recognized.

The window 320 may be disposed on the front surface of the antireflection layer 310 to protect the display panel 300. The window 320 may be attached to the front surface of the antireflection layer 310 by the second adhesive member 402. The window 320 may be made of a transparent material, for example, it may include glass, plastic, or a combination thereof. For example, the window 320 may include ultra-thin glass (UTG) with a thickness of equal to or less than about 0.1 mm, a transparent polyimide, a polyethylene terephthalate (PET), a polycarbonate (PC), or a combination thereof.

The window protection film 330 may be disposed on the front surface of the window 320. The window protection film 330 may be attached to the front surface of the window 320 by the third adhesive member 403. The window protection film 330 may perform at least one function of prevention of scattering by the window 320, absorption of impact, prevention of stabbing, prevention of fingerprints, and prevention of glare.

The protection film 340 may be disposed on the rear side of the display panel 300. The protection film 340 may be attached to the rear side of the display panel 300 by the fourth adhesive member 404. The protection film 340 may support the display panel 300 and may protect the rear side of the display panel 300. The barrier film 350 may be disposed on the rear side of the protection film 340. The barrier film 350 may be attached to the rear side of the protection film 340 by the fifth adhesive member 405. The barrier film 350 may prevent permeation of moisture and oxygen from the outside.

The first support member PL1 and the second support member PL2 may be disposed on the rear side of the barrier film 350 to increase rigidity and firmness of the display device 10. The first support member PL1 and the second support member PL2 may be disposed under the display panel 300 and may support the display panel 300. The first support member PL1 may be attached to the rear side of the barrier film 350 by the sixth adhesive member 406. The sixth adhesive member 406 may not be disposed in the folding area FA to reduce folding stress in case that the display device 10 may be folded. The first support member PL1 may include a metal material, and may be formed to be at least one layer. The first support member PL1 may include fiber reinforced plastic such as carbon fiber reinforced plastic (CFRP), glass fiber reinforced plastic (GFRP), hybrid carbon fiber reinforced plastic (HFRP), or a combination thereof.

The first support member PL1 may include a folding portion 500 that corresponds to the folding area FA so that the display device 10 may be readily bent. A shape of the folding portion 500 may be transformed or its length may be changed in case that the display device 10 may be folded. The folding portion 500 may include a pattern portion in which an opening may be formed, or may include protrusions and depressions. The pattern portion or the protrusions and depressions of the folding portion 500 may be formed by a photolithography technique. Depending on embodiments, the folding portion 500 may include a lattice pattern of openings formed by full etching, or may include a protrusion and depression pattern formed by half etching. The folding portion 500 may include links connected to (or extended from) each other so that it can be readily rotated. Depending on embodiments, the first support member PL1 may instead not include the folding portion 500.

The second support member PL2 may be attached to the rear side of the first support member PL1 by the seventh adhesive member 407. The seventh adhesive member 407 may be a pressure sensitive adhesive (PSA), a thermoplastic polyurethane (TPU) elastomer, or a combination thereof. The seventh adhesive member 407 may not be disposed in the folding area FA.

The second support member PL2 may include a first plate PL2*a* and a second plate PL2*b* spaced apart from the first plate PL2*a*. The first plate PL2*a* may overlap the first non-folding area NFA1, and the second plate PL2*b* may overlap the second non-folding area NFA2. The second support member PL2 may not be disposed in at least a portion of the folding area FA. The first plate PL2*a* and the second plate PL2*b* may be spaced apart from each other with the folding axis (F) therebetween. The second support member PL2 may be provided in a separable form.

The second support member PL2 may include a metal material, and may be formed as at least one multilayer. The second support member PL2 may include fiber reinforced plastic such as carbon fiber reinforced plastic (CFRP), glass fiber reinforced plastic (GFRP), hybrid carbon fiber reinforced plastic (HFRP)), or a combination thereof.

Figure 4:
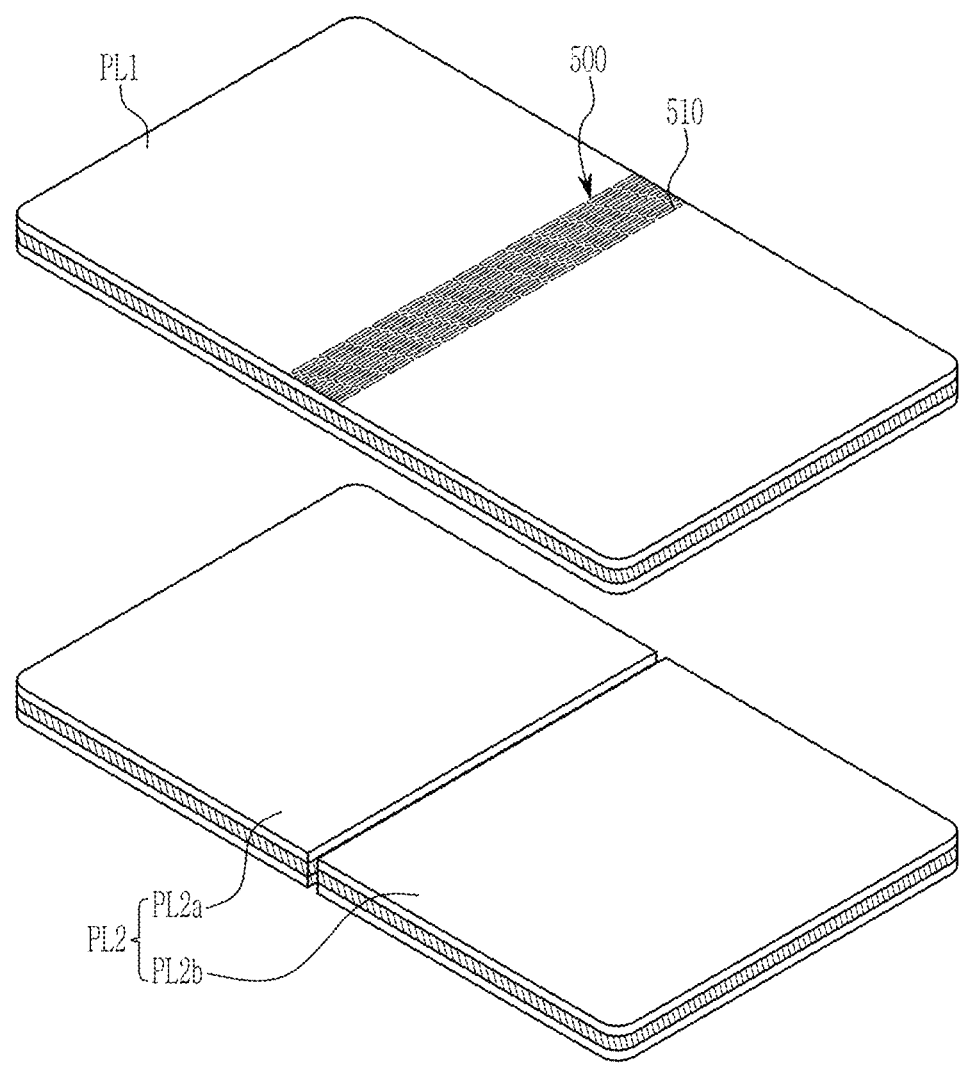
FIG. 4 shows a perspective view of a first support member and a second support member according to an embodiment.
Figure 5:
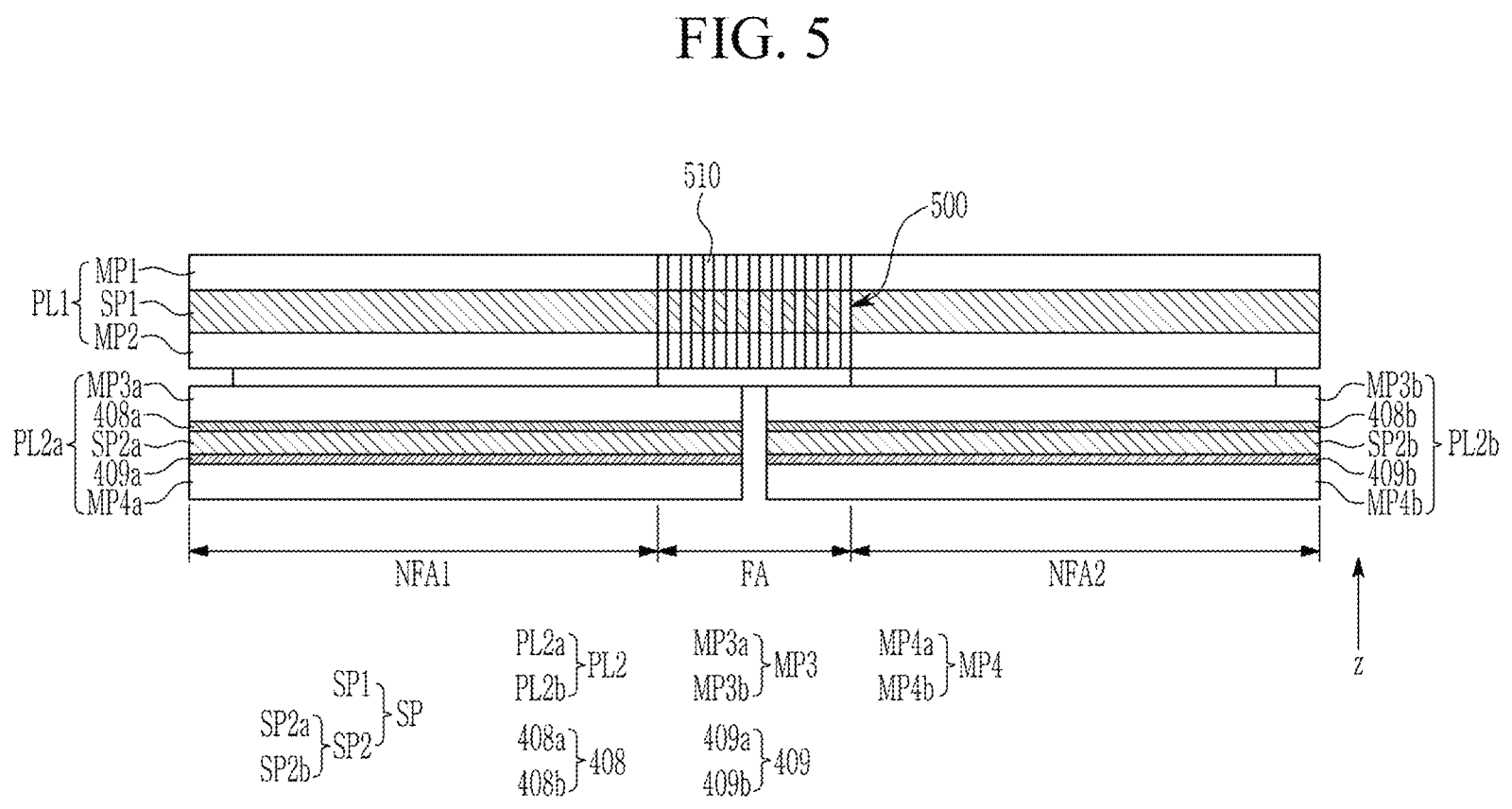

FIG. 4 shows a perspective view of a first support member and a second support member according to an embodiment, and FIG. 5 shows a schematic cross-sectional view of a first support member and a second support member according to an embodiment. Referring to FIG. 4 and FIG. 5, the first support member PL1 and the second support member PL2 may each include a multi-layered structure.

The first support member PL1 may include a first metal layer MP1 and a second metal layer MP2, and a first support layer SP1 disposed between the first metal layer MP1 and the second metal layer MP2. The first support member PL1 may include a clad metal of metal layer/support layer/metal layer, for example, it may include a three-layered clad metal of stainless steel/aluminum/stainless steel. The clad metal may be a material made by rolling at least one metal on another metal and bonding them, giving excellent corrosion resistance. Depending on embodiments, the first support member PL1 may omit at least one of the first metal layer MP1 and the second metal layer MP2. For example, the first support member PL1 may be formed of the single layer of the first support layer SP1 having omitted the first metal layer MP1 and the second metal layer MP2.

The first support member PL1 may include a folding portion 500 that corresponds to the folding area FA of the display device. The folding portion 500 of the first support member PL1 may include a pattern made of multiple openings 510 so that it may be readily folded. The pattern of the folding portion 500 may be formed by a photolithography technique. For example, the folding portion 500 may include a pattern of openings 510 made by a full etching, or may instead include a protrusion and depression pattern partly etched by a half etching technique. Depending on embodiments, the first support member PL1 may not include the folding portion 500.

The first support layer SP1 may include a porous layer of which the surface includes multiple holes or recesses. The porous layer may be disposed on the upper side and the bottom side of the first support layer SP1. The porous layer may include multiple holes 600. The holes 600 may be regularly or irregularly arranged. A width of each hole 600 may be about several nanometers to about several tens of nanometers (nm). A depth of each hole 600 may be about several micrometers to about several tens of micrometers (μm). The holes 600 forming the porous layer may provide an air gap between the first support layer SP1 and upper and lower members (e.g., first and second metal layers). As the air gap may be disposed between the support members for supporting the panel, the magnitude of the force applied to the panel from the outside may be reduced, and the defects (e.g., defects of bright spots) generated by external impact may be reduced.

The first support layer SP1 may include an anodized metal. The anodizing is a metal surface treatment technique and may represent a process of forming an oxide film on the metal surface. For example, in case that a metal base material (e.g., aluminum, etc.) may be set to be a positive electrode and may be electrically conducted while an electrolyte solution may be provided, the surface of the metal base material may be oxidized by the oxygen generated at the positive electrode, and an oxide film (e.g., $Al_2O_3$, etc.) may be formed. In detail, oxygen ions of the electrolyte solution during the anodization approach the metal surface permeate into the existing oxide film, may be combined with metal ions so a porous oxide film may be formed near an interface between the metal and an oxidization layer. The porous oxide film may be formed around an active layer by dissolution of an acidic electrolyte solution, it may grow into the oxide film, and it may form a thick oxide film of equal to or greater than about 10 μm. The width and the depth of the porous holes may be diverse depending on anodization conditions. Anodized aluminum has excellent rigidity and corrosion resistance and includes a porous layer including multiple holes, thereby reducing the weight of the display device.

For example, the first support member PL1 may have a triple-layered structure of stainless steel/aluminum/stainless steel, and an aluminum (Al) layer may be anodized and may include a porous layer on the surface. The first support layer SP1 may be anodized to increase rigidity and corrosion resistance, and may include the porous layer, thereby reducing the weight.

The second support member PL2 may include a first plate PL2a and a second plate PL2b. The first plate PL2a and the second plate PL2b may be spaced apart from each other with the folding axis (F) therebetween. The first plate PL2a may include a third metal layer MP3a, a fourth metal layer MP4a, and a second support layer SP2a disposed between the third metal layer MP3a and the fourth metal layer MP4a. The second plate PL2b may include a third metal layer MP3b, a fourth metal layer MP4b, and a second support layer SP2b disposed between the third metal layer MP3b and the fourth metal layer MP4b.

An eighth adhesive member 408 may be disposed between the third metal layer MP3 and the second support layer SP2, and a ninth adhesive member 409 may be disposed between the fourth metal layer MP4 and the second support layer SP2. The eighth adhesive member 408 and the ninth adhesive member 409 may be a pressure sensitive adhesive (PSA), a thermoplastic polyurethane (TPU) elastomer), or a combination thereof.

The second support member PL2 may include a clad metal of metal layer/support layer/metal layer, for example, it may include a three-layered clad metal of stainless steel/ aluminum/stainless steel. Further, the second support member PL2 may include a bonded structure of metal layer/ adhesive member/support layer/adhesive member/metal layer, for example, it may include a five-layered bonded structure of stainless steel/adhesive member/aluminum/adhesive member/stainless steel. Depending on embodiments, the second support member PL2 may instead be formed as a single layer of the second support layer SP2 having omitted the metal layer and the adhesive layer.

The second support layer SP2 may include a metal layer that may be anodized to include a porous layer on the surface. The porous layer may be formed on respective surfaces of the second support layer SP2. The porous layer may include multiple holes 600. The holes 600 may be regularly or irregularly arranged. The width of each hole 600 may have the size of about several to about several tens of nanometers (nm). The depth of each hole 600 may have the depth of about several to about several tens of micrometers (μm). The width and the depth of the porous holes may be diverse depending on anodization conditions. The holes 600 of the porous layer may provide an air gap between the upper and lower members. As the air gap may be formed between the support members for supporting the panel, the size of the force applied to the panel from the outside may be reduced, and the defects (e.g., defects of bright spots) generated by external impact may be reduced. The above-described second support layer SP2 may be anodized to increase rigidity and corrosion resistance, and may include the porous layer, thereby reducing the weight. For example, the second support layer SP2 may be anodized and may include an aluminum layer including a porous oxide film on the surface.

Figure 6:
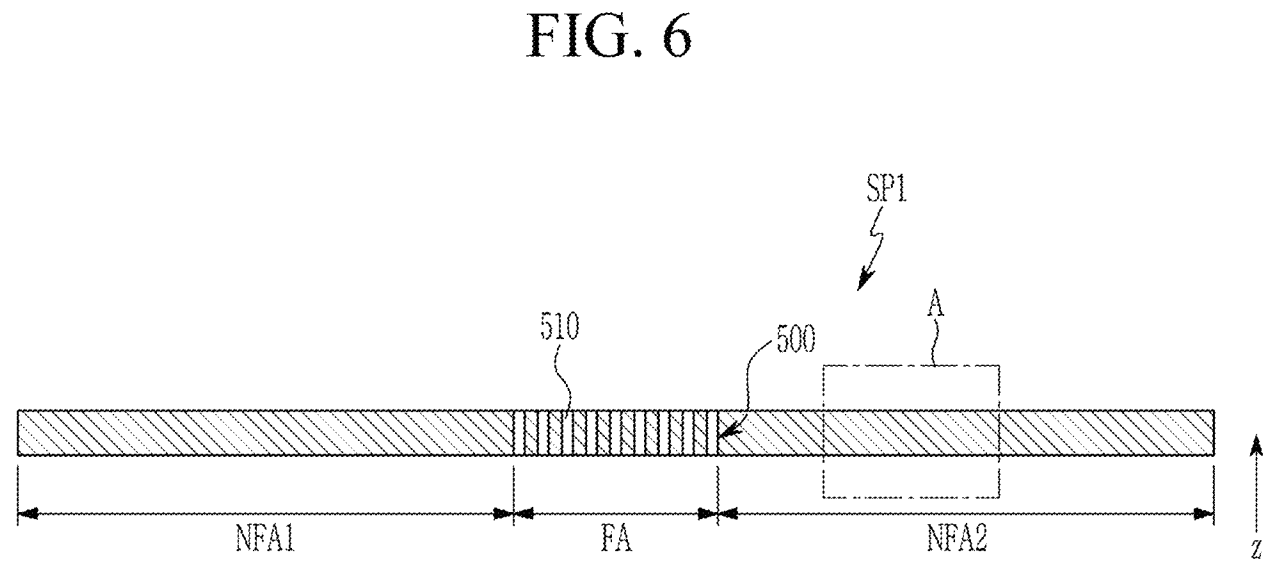
Figure 7:
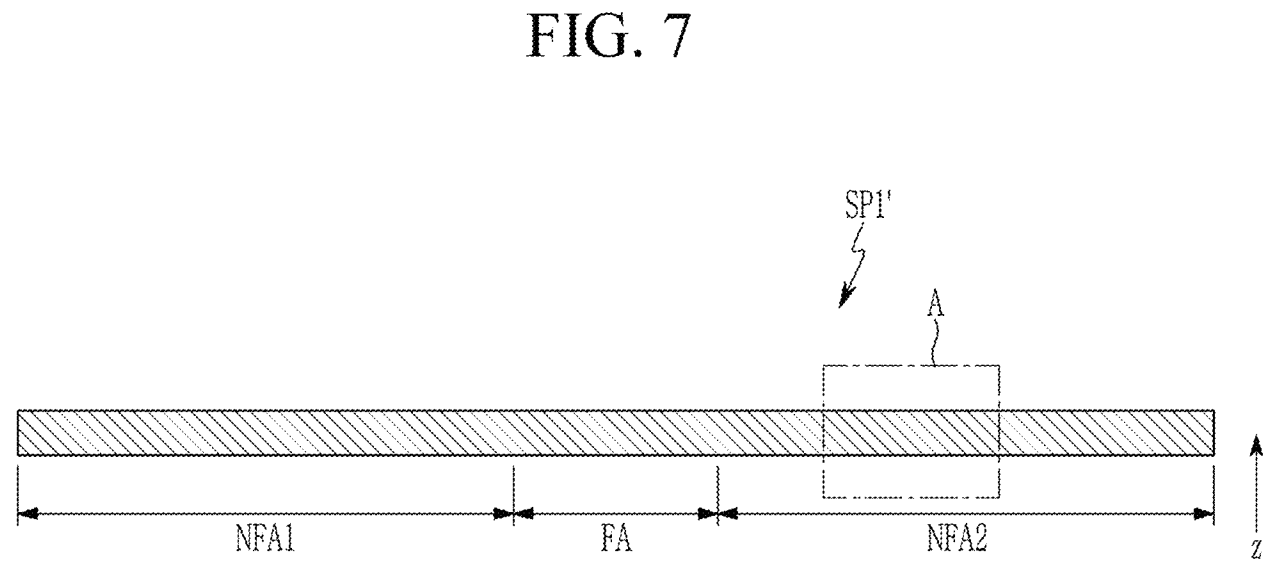

FIG. 6 and FIG. 7 show schematic cross-sectional views of a first support layer SP1 and SP1' respectively according to an embodiment. FIG. 6 shows that the first support layer SP1 includes the folding portion 500, and FIG. 7 shows that the first support layer SP1' does not include the folding portion 500.

Referring to FIG. 6, the first support layer SP1 may include a folding portion 500, and the folding portion 500 may overlap the folding area FA of the display panel in a plan view. The folding portion 500 may include multiple openings 510 for the purpose of readily folding. For example, the folding portion 500 may include a lattice pattern of the openings 510. The lattice pattern of the folding portion 500 may be formed by the photolithography technique. Depending on embodiments, the first support layer SP1 may include a lattice pattern of openings in the folding portion 500, or may instead include a protrusions and depressions pattern. The width of each opening 510 of the lattice pattern of the folding portion 500 may be about several to about several tens of micrometers (μm).

The first support layer SP1 may include an anodized metal. The first support layer SP1 may include a porous layer on at least one side. The width of each hole disposed in the porous layer may be about several to about several tens of nanometers (nm) and the width of each opening 510 of the lattice pattern of the folding portion 500 may be about several tens to about several hundreds of micrometers (μm) so the folding portion 500 including an opening pattern (caused by the full etching technique) and/or a protrusions and depressions pattern (caused by the half etching technique) using the photolithography technique may be formed.

Referring to FIG. 7, the first support layer SP1' may instead not include the folding portion 500. The first support layer SP1' may still include an anodized metal. The first support layer SP1' may include a porous layer on at least one side. The first support layer SP1' may include a porous layer on the entire surface. The porous layer of the first support layer SP1' may be formed in the non-folding areas NFA1 and NFA2 and the folding area FA. As the first support layer SP1' includes the porous layer, its weight may be reduced and rigidity and corrosion resistance may be increased.

As described, rigidity of the first support layer SP1' may be increased according to the anodization technique so the first support layer SP1' may have sufficient rigidity while it may be thin, and hence, it may be readily folded while not forming the folding portion that corresponds to the folding area FA. An additional process (e.g., the photolithography technique) for forming the folding portion may be omitted so productivity may be increased and a yield may be increased.

Figure 8:
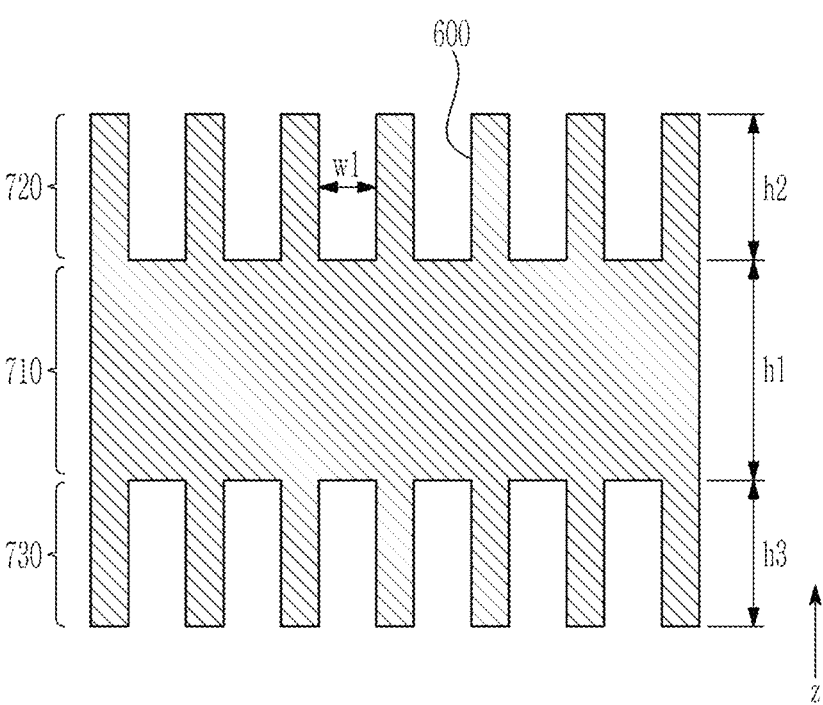
FIG. 8 and FIG. 9 show partially enlarged views of a region A of FIG. 6 and FIG. 7 according to an embodiment.

FIG. 8 shows a partially enlarged view of a region A of the first support layers SP1 and SP1' of FIG. 6 and FIG. 7 respectively according to an embodiment. Referring to FIG. 8, a schematic cross-section of the region A that may be the non-folding area of the first support layer SP1 may be confirmed. The first support layer SP1 may have a structure in which the first porous layer 720 and the second porous layer 730 respectively including holes 600 may be formed on the upper side and the bottom side respectively of the metal base layer 710. The holes 600 may be regularly or irregularly arranged. The width w1 of each hole 600 may be about several to about several tens of nanometers, and the depth h2 may be about several to about several tens of micrometers. The hole 600 configuring the porous layer may provide an air gap between the first support layer SP1 and the upper and lower members, thereby casing an amount of impact applied to the panel by an external shock.

A first porous layer 720 including holes 600 may be formed on at least one side of the metal base layer 710. The first porous layer 720 and the second porous layer 730 may be formed on respective sides of the metal base layer 710. The porous layer including holes 600 may be formed on the entire surface of the metal base layer 710. As the first support layers SP1 and SP1' include the porous layers 720 and 730 in which the holes 600 may be disposed, its weight may be reduced and rigidity and corrosion resistance may be increased.

The first support layer SP1 may include a metal material. The metal material may, for example, include at least one of Al, Ti, Cu, Mg. Zn, Ta, Hf, and Nb. The surface of the first support layer SP1 may be anodized and may include an oxide film including holes. The first support layer SP1 may include an anodized metal. For example, the first support layer SP1 may include anodized aluminum.

Referring to FIG. 8, the metal base layer 710 may be an aluminum base material with the thickness h1 of about 70 μm, and the first and second porous layers 720 and 730 may be aluminum oxide ($Al_2O_3$) films with the thicknesses h2 and h3 of about 15 μm. The thicknesses h2 and h3 of the first and second porous layers 720 and 730 may be changeable in many ways according to anodization conditions. The width W1 of each hole 600 forming the porous layer may be about several to about several tens of nanometers (nm). The porous layer may be formed on the entire surface of the first support layer SP1.

As described, the width W1 of each hole 600 of the anodized first support layer SP1 may be about several to about several tens of nanometers (nm), and the width of each opening 510 of the lattice pattern of the folding portion 500 may be about several tens to about several hundreds of micrometers (μm) so the folding portion 500 including an opening pattern (produced by the full etching technique) and/or a protrusions and depressions pattern (produced by the half etching technique) using the photolithography technique may be disposed on the first support layer SP1.

Figure 9:
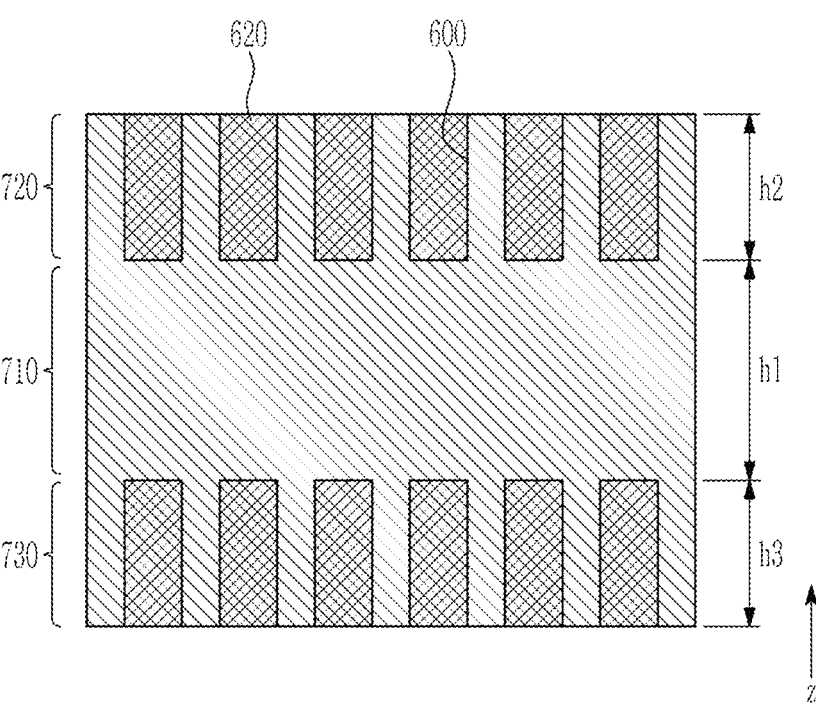

FIG. 9 is different in that the holes 600 of FIG. 8 may be encapsulated or filled by using a dye 620. To prevent contamination of the holes 600, the dye 620 for filling them may be used, and the dye may include an elastic material. By filling the holes 600 with the elastic dye 620 as noted above, the support member may be prevented from being contaminated, and the amount of impact applied to the panel caused by the external shock may be reduced.

Figure 10:
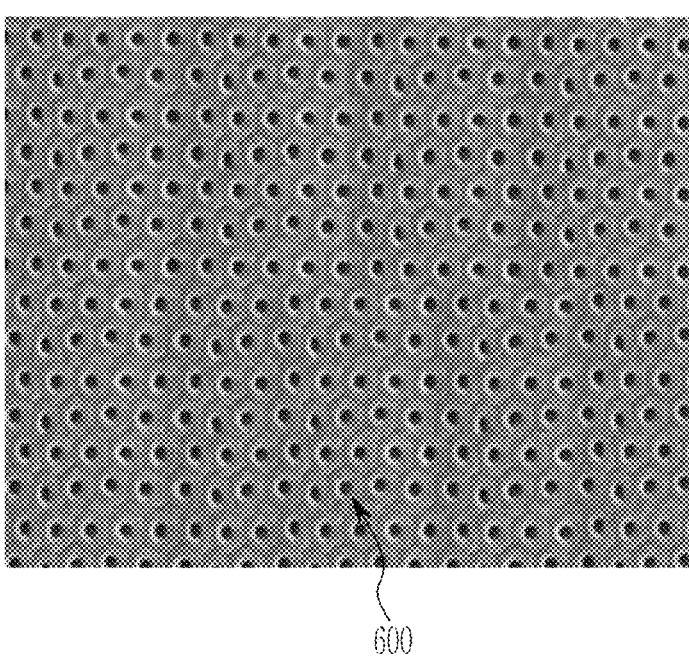
FIG. 10 shows an enlarged top plan view of a porous layer according to an embodiment.

FIG. 10 shows an enlarged top plan view of a porous layer according to an embodiment. The first and second support layers may include a porous layer in which holes 600 may be disposed in at least one side. Referring to FIG. 10, the porous layer may be disposed so that the holes 600 may be randomly disposed. The holes 600 may be formed to have diameters of about several to about several tens of nanometers (nm). The size and the gap of the respective holes 600 may be the same or different from each other. The holes 600 may be disposed on the entire surface of the support layer.

The holes 600 may be formed by anodizing the first and second support layers. The anodized first and second support layers have excellent rigidity and corrosion resistance and include a porous layer including holes 600, thereby reducing the weight of the display device. Further, the holes 600 may provide an air gap between the support layer and the upper and lower members, thereby reducing the impact delivered to the panel by the external shock.

Figure 11:
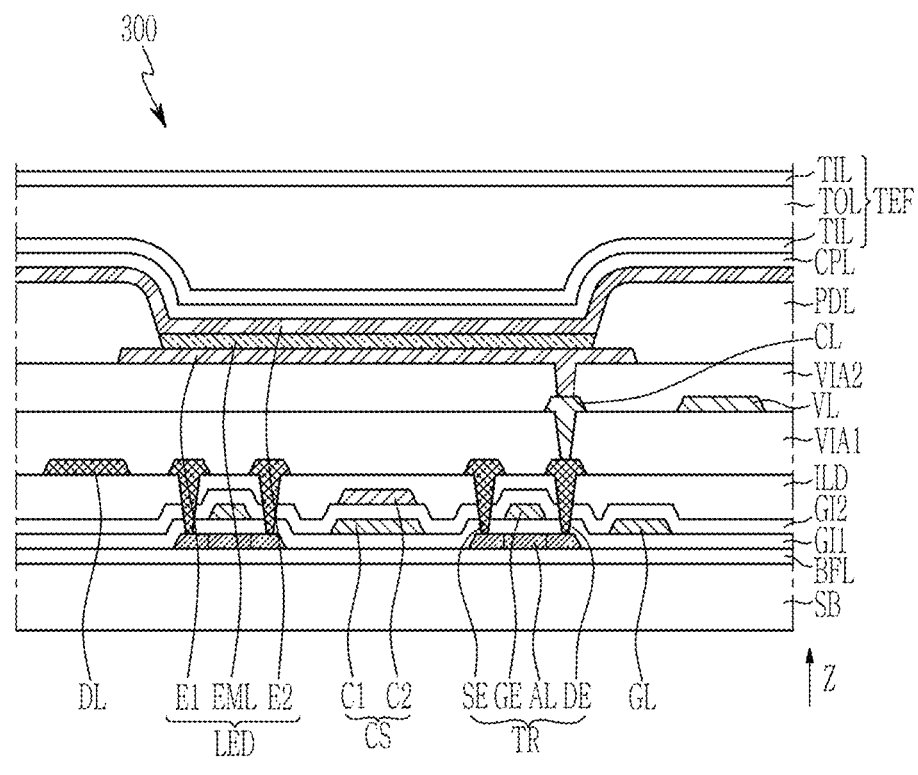
FIG. 11 shows a schematic cross-sectional view of a display panel according to an embodiment.

FIG. 11 shows a schematic cross-sectional view of a stacked structure of a display panel 300 according to an embodiment. The display panel 300 includes a substrate SB, a transistor TR disposed on the substrate SB, and a light-emitting device LED electrically connected to the transistor TR. The substrate SB may be a flexible substrate including a polymer resin such as a polyimide, a polyamide, a polyethylene terephthalate, or a combination thereof.

A buffer layer BFL may be disposed on the substrate SB. The buffer layer BFL may block impurities from the substrate SB in case of forming a semiconductor layer, improve characteristics of the semiconductor layer, and may planarize the surface of the substrate SB to reduce a stress on the semiconductor layer.

The semiconductor layer AL of the transistor TR may be disposed on the buffer layer BFL. The semiconductor layer AL may include a first region, a second region, and a channel region therebetween. The semiconductor layer AL may include one of amorphous silicon, polysilicon, and an oxide semiconductor. A first gate insulating layer GI1 may be disposed on the semiconductor layer AL. The first gate insulating layer GI1 may include an inorganic insulating material such as a silicon nitride, a silicon oxide, a silicon oxynitride, or a combination thereof.

A first gate conductive layer including a gate electrode GE of the transistor TR, a gate line GL, and a first electrode C1 of the capacitor CS may be disposed on the first gate insulating layer GI1. The first gate conductive layer may include molybdenum (Mo), aluminum (Al), copper (Cu), titanium (Ti), or a combination thereof. A second gate insulating layer GI2 may be disposed on the first gate conductive layer. The second gate insulating layer GI2 may include an inorganic insulating material such as a silicon nitride, a silicon oxide, a silicon oxynitride, or a combination thereof. A second gate conductive layer including a second electrode C2 of a capacitor CS may be disposed on the second gate insulating layer GI2. The second gate conductive layer may include molybdenum (Mo), aluminum (Al), copper (Cu), titanium (Ti), or a combination thereof.

An inter-layer insulating layer ILD may be disposed on the second gate insulating layer GI2 and the second gate conductive layer. The inter-layer insulating layer ILD may include an inorganic insulating material such as a silicon nitride, a silicon oxide, a silicon oxynitride, or a combination thereof.

A first data conductive layer including a first electrode SE and a second electrode DE of the transistor TR and a data line DL may be disposed on the inter-layer insulating layer ILD. The first electrode SE and the second electrode DE may be respectively electrically connected to the first region and the second region of the semiconductor layer AL through contact holes in the insulating layers GI1, GI2, and ILD. One of the first electrode SE and the second electrode DE may be a source electrode and the other thereof may be a drain electrode.

A first planarization layer VIA1 may be disposed on the first data conductive layer. The first planarization layer VIA1 may be an organic insulating layer. A second data conductive layer including a voltage line VL and a connection line CL may be disposed on the first planarization layer VIA1. The voltage line VL may transmit voltages such as a driving voltage, a common voltage, an initialization voltage, or a reference voltage. The connection line CL may be electrically connected to the second electrode DE of the transistor TR through the contact hole of the first planarization layer VIA1. The first and second data conductive layers may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), copper (Cu), or a combination thereof.

A second planarization layer VIA2 may be disposed on the second data conductive layer. The second planarization layer VIA2 may be an organic insulating layer. A first electrode E1 of the light-emitting device LED may be disposed on the second planarization layer VIA2. The first electrode E1 may be referred to as a pixel electrode. The first electrode E1 may be electrically connected to the connection line CL through the contact hole in the second planarization layer VIA2. Therefore, the first electrode E1 may be electrically connected to the second electrode DE of the transistor TR and may receive a data signal for controlling luminance of the light-emitting device. The transistor TR electrically connected to the first electrode E1 may be a driving transistor or a transistor electrically connected to the driving transistor. The first electrode E1 may be made of a reflective conductive material or a semi-transmissive conductive material or may be formed of a transparent conductive material.

A pixel defining layer PDL that may be an organic insulating layer may be disposed on the second planarization layer VIA2. The pixel defining layer PDL may be referred to as a cell barrier, and may have an opening overlapping the first electrode E1. An emission layer EML of the light-emitting device LED may be disposed on the first electrode E1. At least one of a hole injection layer, a hole transfer layer, an electron transfer layer, and an electron injection layer in addition to the emission layer EML may be disposed on the first electrode E1.

A second electrode E2 of the light-emitting device LED may be disposed on the emission layer EML. The second electrode E2 may be referred to as a common electrode. The second electrode E2 may transmit visible light by being a thin layer of a metal having a low work function, such as calcium (Ca), barium (Ba), magnesium (Mg), aluminum (Al), silver (Ag), metal alloys thereof, or a combination thereof. The second electrode E2 may include a transparent conductive oxide such as an indium tin oxide (ITO), an indium zinc oxide (IZO), or both.

The first electrode E1, the emission layer EML, and the second electrode E2 of each pixel configure a light-emitting device LED such as an organic light emitting element. The first electrode E1 may be an anode of the light-emitting device, and the second electrode E2 may be a cathode of the light-emitting device.

A capping layer CPL may be disposed on the second electrode E2. The capping layer CPL may increase light efficiency by adjusting a refractive index. The capping layer CPL may entirely cover the second electrode E2. The capping layer CPL may include an organic insulating material, and may include an inorganic insulating material. An encapsulation layer TEF may be disposed on the capping layer CPL. The encapsulation layer TEF may prevent permeation of moisture or oxygen from the outside by encapsulating the light-emitting device LED. The encapsulation layer TEF may be a thin film encapsulation layer including at least one inorganic layer TIL and at least one organic layer TOL. The first and second support members PL1 and PL2 previously discussed in FIGS. 3 to 10 above according to an embodiment may be disposed under the display panel 300 of FIG. 11 and may support the display panel 300 of FIG. 11.

While this disclosure has been described in connection with what is presently considered to be practical embodiments, it is to be understood that the disclosure is not limited to the disclosed embodiments, but, on the contrary, is intended to cover various modifications and equivalent arrangements included within the spirit and scope of the appended claims.

What is claimed is:

1. A display device comprising:
   a display panel including a folding area and a non-folding area; and
   a first support member disposed under the display panel and supporting the display panel, wherein
   the first support member includes a first support layer including a porous layer including a plurality of holes disposed on at least one side, and
   the porous layer overlaps the non-folding area,
   wherein the first support layer includes an anodized metal, and
   wherein the first support layer includes a metal base layer and an oxide film disposed on at least one side of the metal base layer.

2. The display device of claim 1, wherein the porous layer is disposed on an entire surface of the first support layer.

3. The display device of claim 1, wherein the oxide film includes the plurality of holes, and the oxide film is disposed on both an upper side and a bottom side of the metal base layer.

4. The display device of claim 1, wherein the first support layer includes a folding portion overlapping the folding area.

5. The display device of claim 4, wherein the first support member further includes a first metal layer disposed between the display panel and the first support layer, and the first metal layer includes a folding portion overlapping the folding area.

6. The display device of claim 4, wherein the folding portion is selected from a lattice pattern of a plurality of openings, a protrusion and depression pattern, and a plurality of links connected to one another to allow for rotation.

7. The display device of claim 1, wherein the first support member further includes a first metal layer disposed between the display panel and the first support layer; and a cladding of a second metal layer disposed under the first support layer.

8. The display device of claim 1, wherein the metal base layer includes at least one of metal materials including Al, Ti, Cu, Mg, Zn, Ta, Hf, and Nb.

9. A display device comprising:

a display panel;

a first support member disposed under the display panel and supporting the display panel; and a second support member disposed under the first support member and supporting the display panel, wherein the first support member includes a first support layer including a porous layer including a plurality of holes disposed on at least one side, wherein the display panel includes a folding area and a non-folding area, wherein the second support member includes a first plate and a second plate overlapping the non-folding area, and wherein the first plate and the second plate are spaced apart from each other in the folding area.

10. The display device of claim 9, wherein the porous layer is disposed on both an upper side and a bottom side of the first support layer.

11. The display device of claim 9, wherein the first support layer includes an anodized metal.

12. The display device of claim 9, wherein the first support member includes a folding portion overlapping the folding area.

13. The display device of claim 9, wherein the second support member includes a second support layer including a porous layer including a plurality of holes disposed on at least one side.

14. The display device of claim 13, wherein the porous layer of the second support member is disposed on both an upper side and a bottom side of the second support layer.

15. The display device of claim 13, wherein the second support layer includes an anodized metal.

16. A display device comprising:

a display panel;

a first support member disposed under the display panel and supporting the display panel; and a second support member disposed under the first support member and supporting the display panel, wherein the first support member includes:

a first metal layer;

a second metal layer; and a first support layer disposed between the first metal layer and the second metal layer and including a plurality of holes in at least one side, and the second support member includes:

a third metal layer;

a fourth metal layer; and a second support layer disposed between the third metal layer and the fourth metal layer and including a plurality of holes in at least one side.

17. The display device of claim 16, wherein the second support member further includes:

a first adhesive layer disposed between the third metal layer and the second support layer; and a second adhesive layer disposed between the second support layer and the fourth metal layer.

* * * * *